United States Patent [19]

Nakamura

[11] Patent Number: 4,615,441

[45] Date of Patent: Oct. 7, 1986

[54] IC PACKAGE CARRIER

[75] Inventor: Ryuichi Nakamura, Kawasaki, Japan

[73] Assignee: Yamaichi Electric Mfg. Co., Ltd., Tokyo, Japan

[21] Appl. No.: 813,765

[22] Filed: Dec. 27, 1985

[30] Foreign Application Priority Data

Dec. 30, 1984 [JP] Japan .......................... 59-200238[U]

[51] Int. Cl.[4] ...................... B65D 73/02; B65D 85/42
[52] U.S. Cl. ................................... 206/329; 206/331; 206/334
[58] Field of Search ............... 206/328, 329, 331, 332, 206/334

[56] References Cited

U.S. PATENT DOCUMENTS

| | | | |
|---|---|---|---|
| 3,409,861 | 11/1968 | Barnes et al. | 206/334 |
| 4,026,412 | 5/1977 | Henson | 206/331 |
| 4,379,505 | 4/1983 | Alemanni | 206/331 |
| 4,422,547 | 12/1983 | Abe et al. | 206/334 |
| 4,549,651 | 10/1985 | Alemanni | 206/331 |
| 4,556,145 | 12/1985 | Putnam | 206/331 |

Primary Examiner—Joseph Man-Fu Moy

Attorney, Agent, or Firm—Wenderoth, Lind & Ponack

[57] ABSTRACT

An IC package carrier comprises an IC package support plate having a square IC package accommodation section at the center thereof; an IC package press plate having at one end thereof a handle section for causing the IC package press plate to rise from and lie down on the upper surface of the IC package support plate, at the center thereof a square press section for pressing a square IC package, at the other end thereof a hinge mechanism for coupling the IC package press plate to the IC package support plate and serving as hinges about which the IC package press plate is rotated, and two pairs of arms, one pair for connecting the handle section to the square press section and being superposed on one pair of adjacent corners of the IC package accommodated within the square IC package accommodation section of the IC package support plate and the other pair for connecting the square press section to the hinge mechanism and being superposed on the other pair of adjacent corners of the IC package; and closure retaining means provided for detachably retaining the IC package press plate in a state of having lain down on the upper surface of the IC package support plate.

4 Claims, 9 Drawing Figures

IC PACKAGE CARRIER

FIELD OF THE INVENTION AND RELATED ART STATEMENT

The present invention relates to an IC package carrier adapted to be carried with an IC package held therein or subjected to an efficiency test for an IC package with terminals of the IC package protected and brought into contact with contacts of an IC socket.

There have heretofore been developed a number of IC package carriers of this type such as those disclosed in U.S. Pat. Nos. 3,469,684, 3,529,277, 3,652,974, 4,180,161, 4,329,642, 4,435,724 and 4,483,441, and an IC package carrier as related art is disclosed in U.S. Pat. No. 4,535,887.

Generally, an IC package press plate is retained by resiliently shiftable retaining claws provided on an IC package accommodation section of an IC package carrier. Since the IC package carrier is repeatedly used in attachment and detachment of IC packages, the retaining claws are apt to be worn off and, what is worse, to be broken to lose their retaining function. Further, in detaching the IC package from the carrier, it is required to shift the retaining claws against the resiliency of their own. This operation is very troublesome.

OBJECT AND SUMMARY OF THE INVENTION

The present invention has been accomplished in view of the disadvantages suffered by the conventional carriers.

The main object of the present invention is to provide an IC package carrier susceptible of easy attachment and detachment of an IC package and capable of reliably retaining the IC package and stably maintaining the retention state.

To attain the object described above, according to the present invention, there is provided an IC package carrier which comprises an IC package support plate having an IC package accommodation square section; an IC package press plate having at one end thereof a handle section for causing the IC package press plate to rise from and lie down on the upper surface of the IC package support plate, at the center thereof a square press section for pressing a square IC package, at the other end thereof a hinge mechanism constituted by couplings for coupling the IC package press plate to the IC package support plate and serving as hinges about which the IC package press plate is rotated, and a pair of arms for connecting the handle section to the press section and being superposed on one pair of adjacent corners of the IC package accommodated within the IC package accommodation section of the IC package support plate and another pair of arms for connecting the square press suction to the hinge mechanism and being superposed on the other pair of adjacent corners of the IC package; and closure retaining means provided on the handle section of the IC package press plate and a portion of the IC package support plate corresponding to the position of the handle section for detachably retaining the IC package press plate in a state of having lain down on the upper surface of the IC package support plate.

The above and other objects, characteristic features and advantages of the present invention will become more apparent to those skilled in the art as the disclosure is made in the following description of a preferred embodiment of the invention, as illustrated in the accompanying drawings.

DETAILED DESCRIPTION OF THE PREFERRED EMBODIMENT

The present invention will now be described with reference to the illustrated embodiment.

Figure 1:
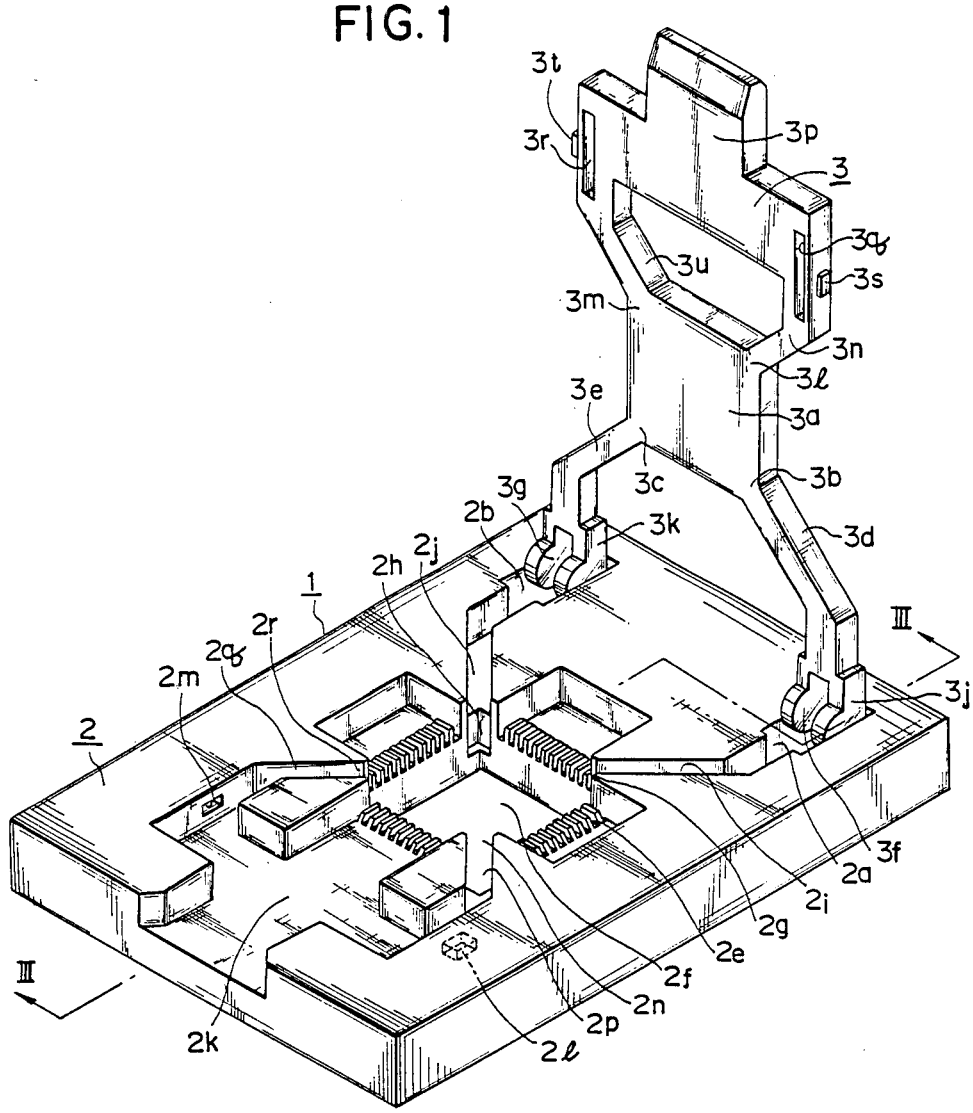
FIG. 1 is a perspective view illustrating one embodiment of an IC package carrier according to the present invention, with an IC package press plate held in its standby position relative to an IC package support plate.

In FIG. 1, reference numeral 1 denotes an IC package carrier as a whole. The carrier 1 comprises an IC package support plate 2 having a square IC package accommodation section 2f at the center thereof, and an IC package press plate 3 provided at the center thereof with a square press section 3a for pressing an IC package.

Figure 4:
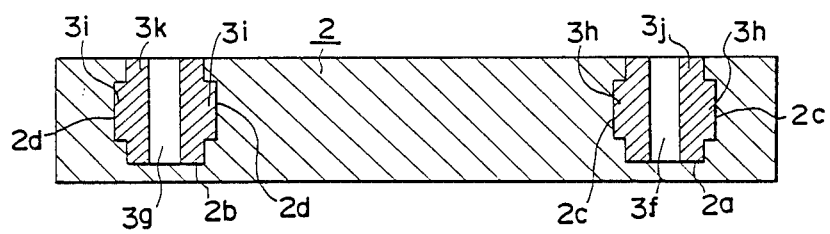
FIG. 4 is a cross section taken along the line IV—IV in FIG. 2.

The press plate 3 comprises the aforementioned press section 3a; four arms 3d, 3e, 3n and 3u extended out respectively from corners 3b, 3c, 3l and 3m of the press section 3a; knuckle-shaped couplings 3j and 3k connected respectively to one pair of the adjacent arms 3d and 3e and provided with cut grooves 3f and 3g for dividing each of the couplings into two parts to afford resiliency to the couplings and, as illustrated in FIG. 4, also provided with projections 3h and 3i on the opposite outer sides across the cut grooves 3f and 3g; and a handle section 3p connected to the other pair of the adjacent arms 3n and 3u for use in operating the press plate 3 to rise from and lie down on the support plate 2, and provided on the opposite outer side surfaces thereof with protuberances 3s and 3t as closure retaining means and in its portions in the vicinity of the opposite outer side surfaces thereof with oblong holes 3q and 3r for affording resiliency to the opposite outer side surfaces.

The support plate 2 has fitting holes 2a and 2b formed therein for accommodating therein the couplings 3j and 3k respectively of the press plate 3 and also has engaging grooves 2c and 2d formed in the inside walls of the fitting holes 2a and 2b for rotatably supporting the projections 3h and 3i of the couplings 3j and 3k as illustrated in FIG. 4. The IC package accommodation section 2f of the support plate 2 is open so as to correspond in position to the press section 3a of the press plate 3.

The support plate 2 has a fitting groove 2k formed in the upper surface thereof at a position corresponding to the position of the handle section 3p of the press plate 3 for accommodating therein the handle section 3p and also has stopping grooves 2l and 2m formed as closure retaining means in the opposite inside walls of the fitting groove 2k for admitting the protuberances 3s and 3t of the press plate 3. Further, there are formed in the upper surface of the support plate 2 accommodating grooves 2i and 2j for connecting one pair of adjacent corners 2g and 2h of the accommodation section 2f respectively to the fitting holes 2a and 2b and accommodating therein the arms 3d and 3e of the press plate 3 such that the arms 3d and 3e intersect the corners 2g and 2h, and accommodating grooves 2p and 2q for connecting the other pair of adjacent corners 2n and 2r of the accommodation section 2f to the fitting groove 2k and accommodating therein the arms 3n and 3u of the press plate such that the arms 3n and 3u intersect the corners 2n and 2r.

Figure 2:
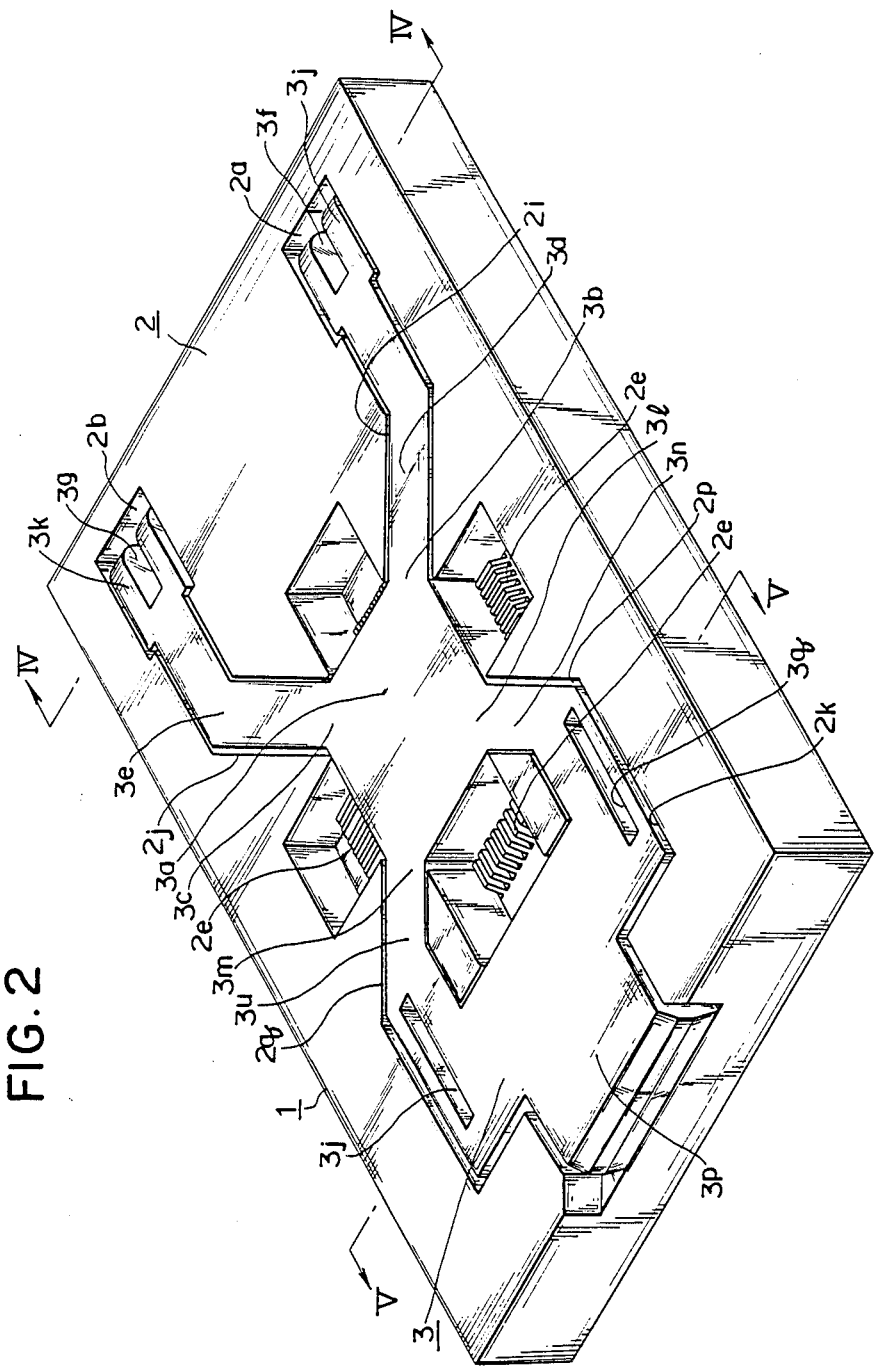
FIG. 2 is a perspective view illustrating the same embodiment, with the press plate caused to lie down on the support plate.

The couplings 3j and 3k of the press plate 3 are accommodated respectively within the fitting holes 2a and 2b of the support plate 2, with the projections 3h and 3i engaged resiliently in the engaging grooves 2c and 2d to constitute a detachable hinge mechanism. The press plate 3 is thus attached to the support plate 2 through the detachable hinge mechanism so as to be capable of rising from and lying down on the upper surface of the support plate 2. When the press plate 3 is caused to lie down on the support plate 2 and the protuberances 3s and 3t of the press plate 3 are engaged in the stopping grooves 2l and 2m of the support plate 2, with the handle section 3p, the press section 3a and the four arms 3d, 3e, 3n and 3u accommodated respectively within the fitting groove 2k, the accommodation section 2f and the accommodating grooves 2i, 2j, 2p and 2q, the upper surface of the press plate 3 is substantially flush with the upper surface of the support plate 2 as illustrated in FIG. 2. The four sides of the accommodation section 2f excluding the corners 2g, 2h, 2n and 2r thereof are provided with receiving grooves 2e for receiving therein terminals 4a extending outwardly from the four sides of a square IC package 4. Optionally, by setting the four arms snugly fitted in the four accommodating grooves, frictional engagement between the arms and accommodating grooves may be obtained without utilizing the closure retaining means comprising the protuberances, oblong holes and stopping grooves.

Figure 3:
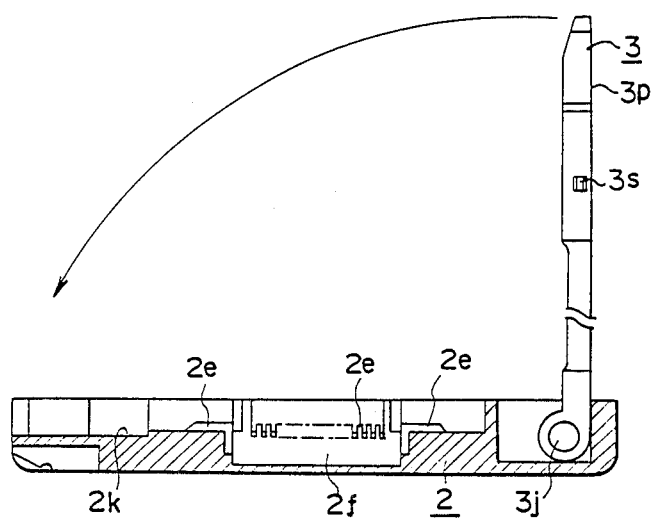
FIG. 3 is a cross section taken along line III—III in FIG. 1.
Figure 5:
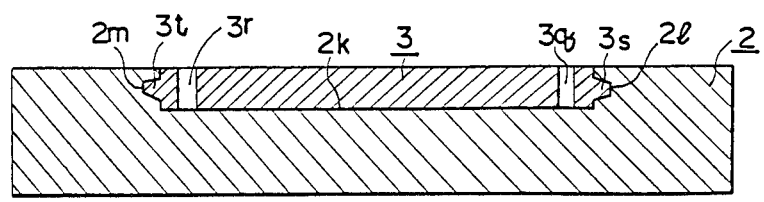
FIG. 5 is a cross section taken along line V—V in FIG. 2.
Figure 6:
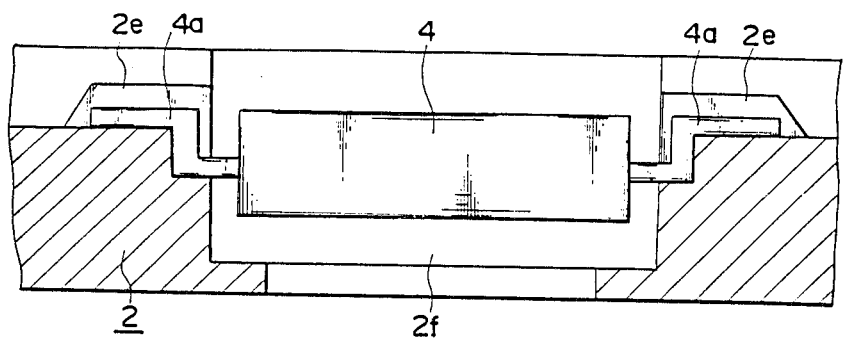
FIG. 6 is a cross section illustrating an IC package which has been set in position within an IC package accommodation section of the support plate.

In use of the IC package carrier 1 having the construction described above, the IC package 4 is set in position within the IC package accommodation section 2f of the support plate 2 with the terminals 4a of the IC package 4 received within the receiving grooves 2e of the accommodation section 2f (FIG. 6). The press plate 3 rising upright as shown in FIGS. 1 and 3 is then caused to lie down on the upper surface of the support plate 2, thereby accommodating the handle section 3p within the fitting groove 2k and causing the protuberances 3s and 3t on the opposite sides of the handle section 3p to be resiliently engaged in the stopping grooves 2l and 2m in the opposite inside walls of the fitting groove 2k, with the result that the press plate 3 is prevented from rising (FIGS. 2 and 5). In this state, the IC package 4 accommodated within the accommodation section 2f is pressed by the press section 3a of the press plate 3 with exactitude (FIG. 8) and the arms 3d, 3e, 3n and 3u and the press section 3a of the press plate 3 are accommodated respectively within the accommodating grooves 2i, 2j, and 2q and the accommodation section 2f of the support plate 2. Therefore, the press plate 3 and the support plate 2 are united with each other with their upper surfaces kept substantially flush with each other. The protuberances 3s and 3t can be disengaged from the stopping grooves 2l and 2m by urging the handle section 3p upwardly while utilizing the oblong holes 3q and 3r which afford resiliency to the opposite outer side surfaces of the press plate 3. After this disengagement, the press plate 3 is allowed to rotate with the hinge mechanism as a fulcrum. When the press plate 3 is rotated until its standby position, as illustrated in FIG. 1, the IC package 4 can be detached from the accommodating section 2f of the support plate 2. Therefore, the carrier is susceptible of easy attachment and detachment of the IC package and can be used advantageously in an efficiency test for the IC package. The projections 3h and 3i can be disengaged from the engaging grooves 2c and 2d by utilizing the cut grooves 3f and 3g which afford resiliency to the couplings 3j and 3k.

Figure 7:
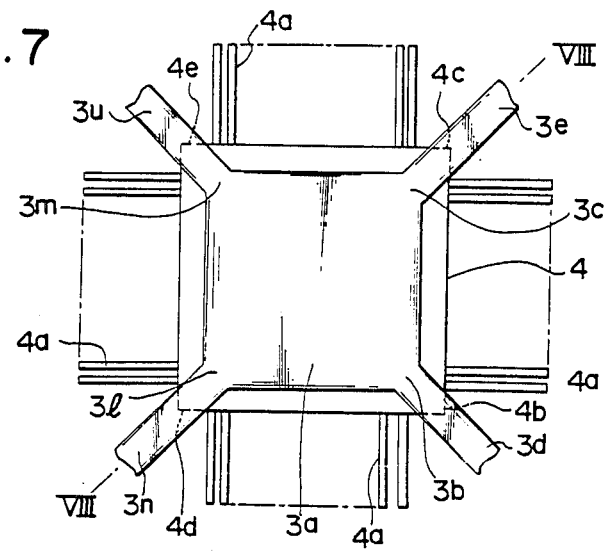
FIG. 7 is a plan view illustrating the state wherein the IC package accommodated within the accommodation section has been pressed by a square press section of the press plate.
Figure 8:
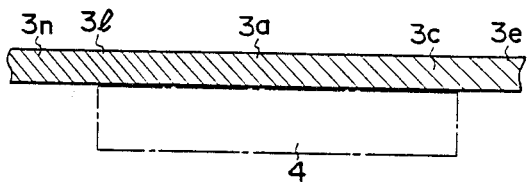
FIG. 8 is a cross section taken along line VIII—VIII in FIG. 7.
Figure 9:
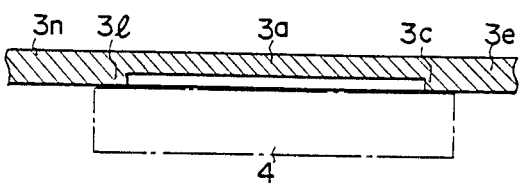
FIG. 9 is a cross section illustrating a modification of the press section of the press plate.

As illustrated in FIGS. 7 and 8, the upper surface of the IC package 4 accommodated within the accommodation section 2f of the support plate 2 is pressed by the press section 3a at the center thereof and the corners 4b, 4c, 4d and 4e of the IC package 4 are pressed respectively by the arms 3d, 3e, 3n and 3u extending radially from the corners 3b, 3c, 3l and 3m of the press section 3a of the press plate 3. Optionally, the center portion of the press section 3a may be away from the upper surface of the IC package 4 with the portions of the arms 3d, 3e, 3n and 3u in the vicinity of the corners 3b, 3c, 3l and 3m of the pres section 3a pressed against the corners 4b, 4c, 4d and 4e of the IC package 4 as illustrated in FIG. 9. Further, the edge of the IC package 4 may optionally be pressed by either the peripheral edge or a pair of opposite edges of the press section 3a of the press plate 3 though not illustrated.

According to the present invention, as described above, since the square press section formed at the center of the IC package press plate attached to the IC package support plate so as to be capable of rising from and lying down on the support plate and/or the base portions of the arms radially extending outwardly from the corners of the press section press the upper surface and/or the corners of the IC package, the terminals projecting from the four sides of the IC package can be exposed to the spaces between the adjacent arms and connected to the contacts of the IC socket without hindrance. Further, since the center portion of the upper surface and/or the four corners of the IC package are pressed by the press section of the press plate and/or the four arms extending from the four corners of the square press section to support the press section, the IC package can be pressed with exactitude. Therefore, the present invention can provide an IC package carrier capable of eliminating the conventional drawbacks such that the IC package retaining claws are worn off or broken and that the IC package is accidentally dropped from the carrier due to vibration, impact or any other external force.

What is claimed is:
1. An IC package carrier comprising:
   an IC package support plate having a square IC package accommodation section at the center thereof;
   an IC package press plate having at one end thereof a handle section for causing the IC package press plate to rise from and lie down on the upper surface of said IC package support plate, at the center thereof a square press section for pressing a square IC package, at the other end thereof a hinge mechanism constituted by couplings for coupling said IC package press plate to said IC package support plate and serving as hinges about which said IC package press plate is rotated, and two pairs of arms, one pair for connecting said handle section to said square press section and being superposed on one pair of adjacent corners of the IC package accommodated within said square IC package accommodation section of said IC package support plate and the other pair for connecting said square press section to said hinge mechanism and being superposed on the other pair of adjacent corners of the IC package; and closure retaining means provided on said handle section of said IC package press plate and a portion of said IC package support plate corresponding to the position of said handle section for detachably retaining said IC package press plate in a state of having lain down on the upper surface of said IC package support plate.

2. An IC package carrier according to claim 1, wherein said IC package support plate has accommodating grooves formed in the upper surface thereof so as to communicate with the corners of said IC package accommodation section and accommodate therein said two pairs of arms of said IC package press plate.

3. An IC package carrier according to claim 1, wherein said square press section of said IC package press plate has its portions in the vicinity of the corners thereof pressed against the IC package and has its center apart from the upper surface of the IC package when said IC package press plate has lain down on the upper surface of said IC package support plate.

4. An IC package carrier according to claim 1, wherein said hinge mechanism comprises a pair of couplings provided on one end of said IC package press plate and provided each with a cut groove for affording resiliency to said couplings and with a pair of projections disposed on the opposite outer sides thereof across said cut groove, and engaging grooves formed in said IC package support plate for resiliently admitting said projections to rotatably and detachably attach said IC package press plate to said IC package support plate; and said closure retaining means comprises protuberances provided on the opposite outer side surfaces of said handle section, oblong holes formed in portions of said handle section in the vicinity of the opposite outer side surfaces thereof to afford resiliency to the opposite outer side surfaces, and stopping grooves formed in said IC package support plate in position corresponding to the positions of said protuberances for resiliently admitting said protuberances.

* * * * *